United States Patent

Arai et al.

[11] Patent Number: 5,910,658
[45] Date of Patent: Jun. 8, 1999

[54] METHOD AND SYSTEM FOR CHANGED PARTICLE BEAM EXPOSURE

[75] Inventors: Soichiro Arai; Kenichi Miyazawa; Hidefumi Yabara; Hiroshi Yasuda, all of Kawasaki; Takayuki Nakatani, Tokyo, all of Japan

[73] Assignees: Fujitsu Limited, Kawasaki; Advantest Corporation, Tokyo, both of Japan

[21] Appl. No.: 09/027,470

[22] Filed: Feb. 20, 1998

[30] Foreign Application Priority Data

Apr. 11, 1997 [JP] Japan ................................. 9-094199

[51] Int. Cl.$^6$ ................................................. H01J 37/302
[52] U.S. Cl. ........................................ 250/492.22; 250/398
[58] Field of Search .................... 250/492.22, 492.23, 250/492.2, 398

[56] References Cited

U.S. PATENT DOCUMENTS 5,369,282  11/1994  Arai et al. ........................... 250/492.22

*Primary Examiner*—Kiet T. Nguyen
*Attorney, Agent, or Firm*—Staas & Halsey

[57] ABSTRACT

Adjusting variable delay circuit 311, receiving signal S1, is connected to the input of drive circuit 312. A time point t1, when the output potential of drive circuit 312 traverses reference potential VA between the potential Va of traveling wave V1F of the output potential and 0 V, is detected by comparator 52 for detecting the front edge of V1F, detecting variable delay circuit 50 for delaying signal S1 and D flip-flop 51 for holding the output of comparator 52 at the timing of front edge of the signal outputted from delay circuit 50. A time point t2, when the output potential of drive circuit 312 traverses reference potential VB between the superimposed potential of traveling wave V1F and reflected wave V1B and VA, is detected by comparator 62 for detecting the front edge of V1B, detecting variable delay circuit 60 for delaying signal S1 and D flip-flop 61 for holding the output of comparator 62 at the timing of front edge of the signal outputted from delay circuit 60. The delay time of adjusting variable delay circuit 311 is set so that value $\{t1+(t2-t1)/2\}$ becomes substantially same as to all the output potentials of drive circuit 31 and so on.

15 Claims, 11 Drawing Sheets

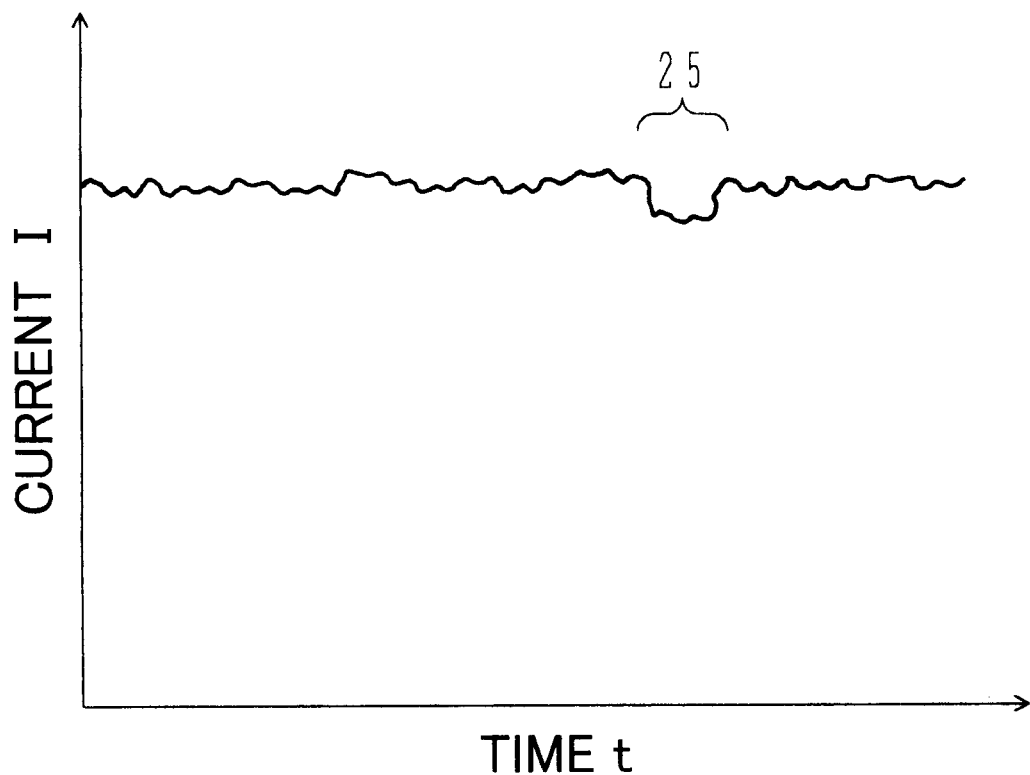

METHOD AND SYSTEM FOR CHANGED PARTICLE BEAM EXPOSURE

BACKGROUND OF THE INVENTION

1. Field of the Invention

The present invention relates to a method and a system for charged particle beam exposure.

2. Description of the Related Art

FIG. 9 schematically shows the construction of a conventional charged particle beam exposure system.

In chamber 10, electron beam EB0 emitted from electron gun 11 has its cross section shaped by the rectangular aperture of aperture stop 12, passes through electromagnetic lens 13 to be substantially paralleled and is incident on blanking aperture array mask 14. Blanking aperture array mask 14 has a number of, for example, 1024 apertures being two-dimensionally arranged. FIG. 10 shows apertures 141 to 143 among the apertures. By apertures 141 to 143, electron beam EB0 is shaped into multiple beams. At the edges of apertures 141 to 143 of blanking aperture array mask 14, paired electrodes E1 and G1, paired electrodes E2 and G2 and paired electrodes E3 and G3 are formed, respectively. Electrodes G1, G2 and G3 are set at 0 V by being connected to a non-illustrated common grounding conductor. For example, when electrodes E1 and E3 are set at 0 V and electrode E2 at 15 V, as shown in the figure, electron beams EB1 passing through apertures 141 and 143 are not deflected and electron beam EB2 passing through aperture 142 is deflected.

In FIG. 9, due to the influence of electromagnetic lens 13, electron beams EB1 converge to the position of the aperture formed in aperture stop 15 disposed below and passes through the aperture, whereas electron beam EB2 is intercepted by aperture stop 15. Blanking deflector 16 disposed between blanking aperture array mask 14 and aperture stop 15 is used in order that electron beams EB1 and EB2 having passed through blanking aperture array mask 14 are all intercepted by aperture stop 15 at high speed. Electron beams EB1 having passed through the aperture of aperture stop 15 are converged by objective lens 17 onto a non-illustrated wafer mounted on movable stage 18. Thus, a pattern corresponding to a binary potential pattern to be applied to electrodes E1 to E3 of blanking aperture array mask 14 is projected onto the wafer with demagnification. Major deflector 19 and sub-deflector 20 disposed above movable stage 18 are provided for causing electron beams EB1 to scan on the wafer.

Electrodes E1 to E3 of blanking aperture array mask 14 are supplied with a drive voltage pattern into which a signal pattern outputted from pattern generator 21 has been converted by BAA driver 22.

Electron beam exposure, which is performed through scanning by electron beams, requires a longer processing time than optical exposure. To reduce the processing time, the transfer rate of each bit of the output of pattern generator 21 is set at high bps such as 400 Mbps. For this reason, variation among bits in signal propagation delay time from the output of pattern generator 21 to the electrodes of blanking aperture array mask 14 affects the accuracy of the exposure pattern on the wafer.

Therefore, conventionally, in the adjustment stage of the charged particle beam exposure system, electron beams EB1 are captured by Faraday cup 23 mounted on movable stage 18 and is provided to delay time detecting circuit 24 as current I, while the output of pattern generator 21 is provided to delay time detecting circuit 24. Then, by delay time detecting circuit 24, the time from the instance when the output of pattern generator 21 changes to the instance when current I changes is detected for each bit of the output of pattern generator 21. The delay time of each bit may be detected, for example in FIG. 10, by successively changing potential group (V1, V2, V3) to be supplied to electrodes E1, E2 and E3 to (0, 0, 0), to (15, 0, 0), to (0, 0, 0), to (0, 15, 0), to (0, 0, 0) and to (0, 0, 15).

FIG. 11 shows variation in current I when all of the 1024 multiple beams from blanking aperture array mask 14 are captured by Faraday cup 23 and then, one of the beams is intercepted by aperture stop 15 for a predetermined period of time. Negative pulse 25 indicates the interception time.

However, the SN ratio is low because the variation in current I is small and even if the transmission line from Faraday cup 23 to delay time detecting circuit 24 of FIG. 9 is of high quality, the pulse shape of current I becomes dull, so that the accuracy of the delay time detection decreases.

SUMMARY OF THE INVENTION

Accordingly, it is an object of the present invention to provide a method and a system for charged particle beam exposure which are capable of more accurately measuring a signal propagation delay time and capable of adjusting so that variation among bits in signal propagation delay time from a predetermined position to the electrodes of a blanking aperture array mask reduces.

In the 1st aspect of the present invention, there is provided a charged particle beam exposure method wherein a charged particle beam passes through apertures of a blanking aperture array mask to be converted into multiple beams, each of output potentials of a drive circuit is respectively provided to each of deflecting electrodes formed at edges of the apertures and a pattern corresponding to a pattern of the output potentials is projected onto an object, the method comprising the steps of: preparing a variable delay circuit connected to an input side of the drive circuit; detecting a first time point t1 when a traveling wave of one of the output potentials from the drive circuit traverses a first reference potential; detecting a second time point t2 when a superimposed wave of the traveling wave and a reflected wave of the one of the output potentials traverses a second reference potential; and adjusting a delay time of the variable delay circuit based on the first time point t1 and the second time point t2.

According to the 1st aspect of the present invention, signal propagation delay time T from a predetermined position, for example, the input or the output of the adjusting variable delay circuit or the output of the drive circuit to the electrodes of the blanking aperture array mask becomes substantially same, resulting in improved accuracy of a exposure pattern projected onto a sample such as a wafer or a mask.

Since it is unnecessary to detect a beam current with a Faraday cup, the SN ratio can be higher than in the case of FIG. 9. In addition, since the comparatively long signal transmission line from the Faraday cup to a delay time detecting circuit is unnecessary, the dullness of the signal can be smaller than in the case of FIG. 9. Thus, signal propagation delay time T can be more accurately measured than was previously possible.

Since signal propagation delay time T is automatically adjusted, the time necessary for adjusting can be reduced, so that exposure throughput improves.

In the 2nd aspect of the present invention, there is provided a charged particle beam exposure method as defined in the 1st aspect, wherein the adjusting is performed in such a way that values $\{t1+(t2-t1)/2\}$ in regard to all of the output potentials become substantially same to each other.

According to the 2nd aspect of the present invention, signal propagation delay time T can be adjusted including the signal propagation delay time of the drive circuit. When signal propagation delay time T differs from those for other drivers, it is considered that disconnection exists on the transmission line from the drive circuit output onward and the disconnection location can be estimated with some degree of accuracy based on the difference from other signal propagation delay times.

In the 3rd aspect of the present invention, there is provided a charged particle beam exposure method as defined in the 2nd aspect, wherein the first time point t1 and the second time point t2 are detected repeatedly, and wherein each of the values $\{t1+(t2-t1)/2\}$ is calculated by substituting a typical value of the first time point t1 and a typical value of the first time point t2.

According to the 3rd aspect of the present invention, the measurement accuracy of signal propagation delay time T improves.

In the 4th aspect of the present invention, there is provided a charged particle beam exposure method as defined in the 1st aspect, wherein the adjusting is performed in such a way that values $(t2-t1)/2$ in regard to all of the output potentials become substantially same to each other.

The 4th aspect of the present invention is effective for a case where variation among bits in signal propagation delay time of the drive circuit is smaller than variation among bits in signal propagation delay time from the output of the drive circuit to the electrodes of the blanking aperture array mask and is negligible.

In the 5th aspect of the present invention, there is provided a charged particle beam exposure method as defined in the 4th aspect, wherein the first time point t1 and the second time point t2 are detected repeatedly, and wherein each of the values $(t2-t1)/2$ is calculated by substituting a typical value of the first time point t1 and a typical value of the first time point t2.

According to the 5th aspect of the present invention, the measurement accuracy of signal propagation delay time T is superior to that of the 4th aspect.

In the 6th aspect of the present invention, there is provided a charged particle beam exposure method as defined in the 1st aspect, further comprising the step of determining as short-circuited when the second time point t2 cannot be detected even if a set period of time has elapsed.

According to the 6th aspect of the present invention, short circuit may be detected at the same time as the adjustment of the signal propagation delay time.

In the 7th aspect of the present invention, there is provided a charged particle beam exposure system provided with a blanking aperture array mask having blanking apertures for a charged particle beam being passed through to be converted into multiple beams, the blanking apertures being edged with deflecting electrodes, and provided with a drive circuit for providing its output potentials to the deflecting electrodes so as to project a pattern onto an object, the pattern corresponding to a pattern of the output potentials, the system comprises: an adjusting variable delay circuit connected to an input side of the drive circuit to delay propagation of the output potentials; a first comparator circuit for comparing one of the output potentials from the drive circuit and a first reference potential to detect a front edge of a traveling wave of the one of the output potentials; a second comparator circuit for comparing the one of the output potentials and a second reference potential to detect a front edge of a reflected wave superimposed on the traveling wave of the one of the output potentials; a first detecting circuit for detecting a first time point t1 when an output of the first comparator circuit is inverted; a second detecting circuit for detecting a second time point t2 when an output of the first comparator circuit is inverted; and adjusting equipment for adjusting a delay time of the adjusting variable delay circuit based on the first time point t1 and the second time point t2.

According to the 7th aspect of the present invention, the same effects of the 1st aspect can be obtained.

In the 8th aspect of the present invention, there is provided a charged particle beam exposure system as defined in the 7th aspect, wherein the first detecting circuit comprises: a first detecting variable delay circuit for delaying a signal of an input side of the drive circuit; and a first determination circuit for determining an output state of the first comparator circuit in response to an output of the first detecting variable delay circuit, and wherein the second detecting circuit comprises: a second detecting variable delay circuit for delaying a signal of the input side of the drive circuit; and a second determination circuit for determining an output state of the second comparator circuit in response to an output of the second detecting variable delay circuit.

In the 9th aspect of the present invention, there is provided a charged particle beam exposure system as defined in the 8th aspect, wherein the first determination circuit comprises a first D flip-flop circuit having its data input adapted to receive an output of the first comparator circuit and having its clock input adapted to receive the output of the first detecting variable delay circuit, and wherein the second determination circuit comprises a second D flip-flop circuit having its data input adapted to receive an output of the second comparator circuit and having its clock input adapted to receive the output of the second detecting variable delay circuit.

In the 10th aspect of the present invention, there is provided a charged particle beam exposure system as defined in the 9th aspect, wherein the adjusting equipment adjusts the delay time in such a way that values $\{t1+(t2-t1)/2\}$ in regard to all of the output potentials become substantially same to each other.

In the 11th aspect of the present invention, there is provided a charged particle beam exposure system as defined in the 10th aspect, wherein the adjusting equipment causes the first and second detecting circuits to detects the first time point t1 and the second time point t2 repeatedly and calculating each of the values $\{t1+(t2-t1)/2\}$ by substituting a typical value of the first time point t1 and a typical value of the first time point t2.

In the 12th aspect of the present invention, there is provided a charged particle beam exposure system as defined in the 7th aspect, wherein one set of the first and second comparator circuits and the first and second detecting circuits are provided for a plurality of sets of the adjusting variable delay circuits and the drive circuits, wherein the system further comprising: a first selector circuit for selecting one of outputs of the plurality of sets of the drive circuits and providing the one of the output to the one set of the first and second comparator circuits; and a second selector circuit for selecting one of inputs of the plurality of sets of the adjusting variable delay circuits and providing the one of the inputs to the one set of the first and second detecting circuits; and wherein the adjusting equipment causes the first and second selector circuits to select the one of the plurality of sets.

According to the 12th aspect of the present invention, the number of sets of 1st and 2nd comparator circuits and 1st and 2nd detecting circuits may be reduced, so that the construction can be simplified.

BRIEF DESCRIPTION OF THE DRAWINGS

FIG. 11 is a diagram showing changes in electron beam current detection value.

DESCRIPTION OF THE PREFERRED EMBODIMENTS

Figure 1:
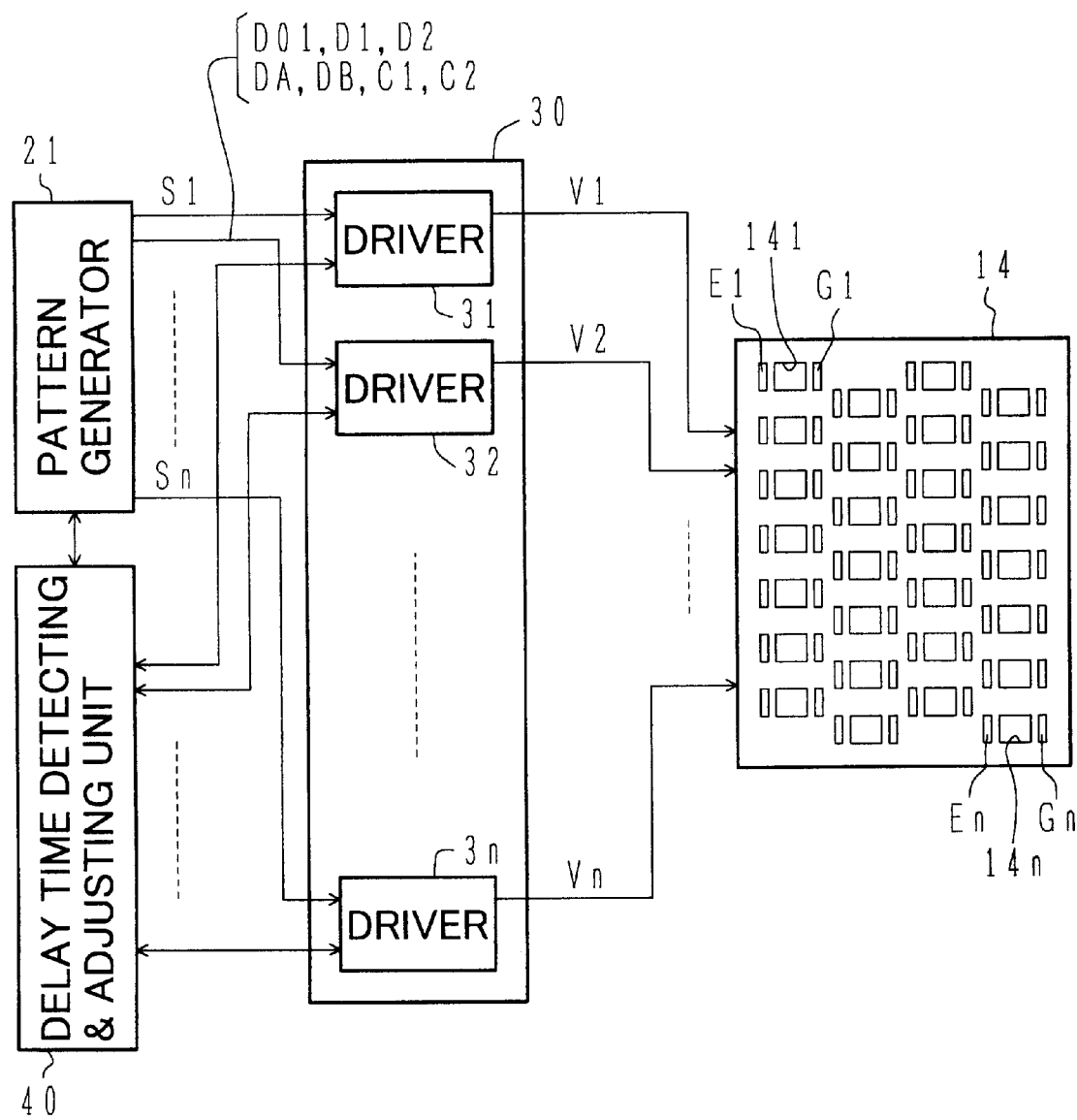
FIG. 1 is a block diagram showing a circuit for electrodes on a blanking aperture array mask in a first embodiment of the present invention.

Referring now to the drawings, wherein like reference characters designate like or corresponding parts throughout several views, preferred embodiments of the present invention are described below.

First Embodiment

FIG. 1 is a block diagram schematically showing the construction of a circuit for electrodes on blanking aperture array mask 14.

Figure 2:
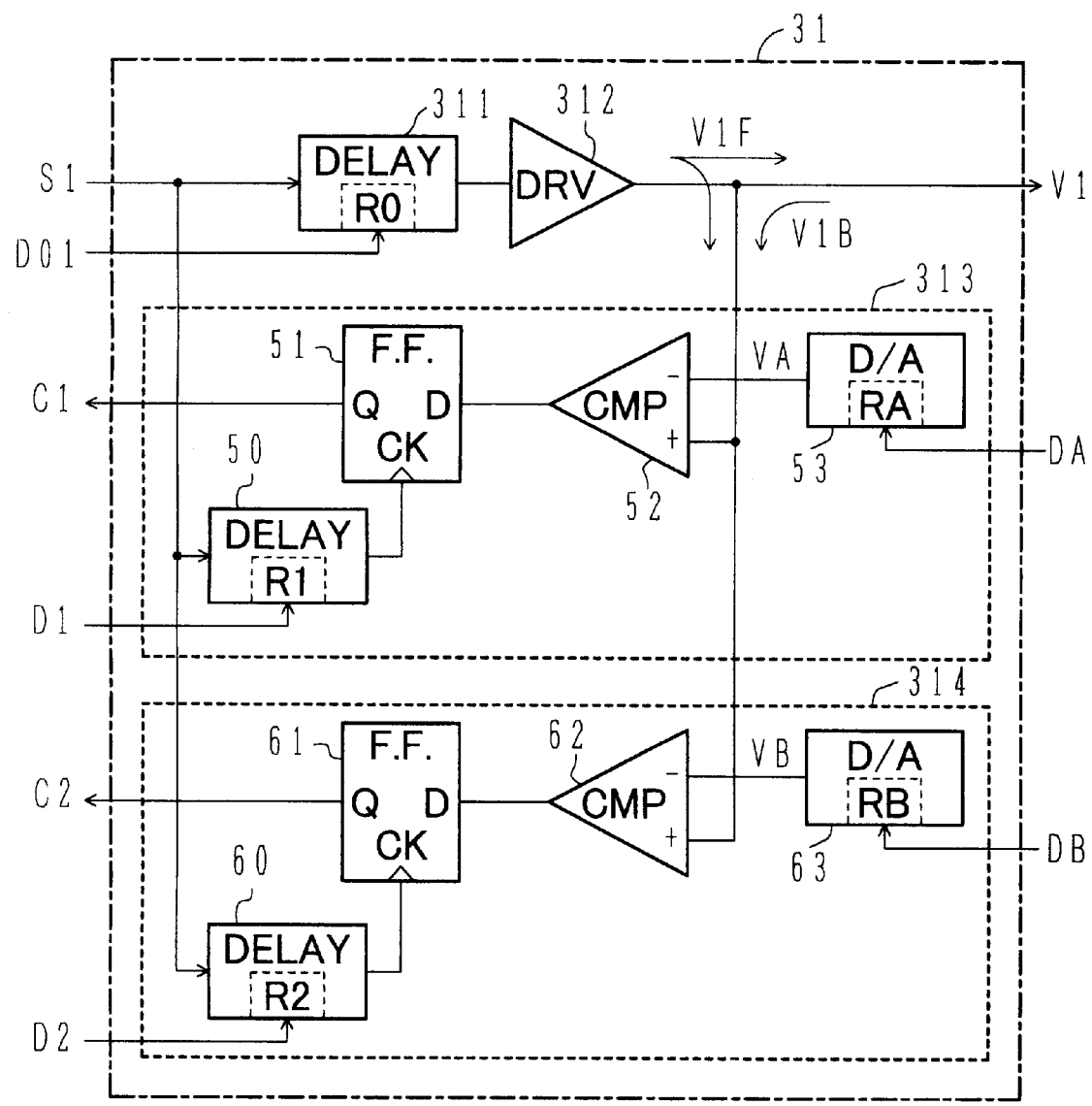
FIG. 2 is a circuit diagram showing a construction example of a driver in FIG. 1.

Blanking aperture array mask 14 has n apertures 141 to 14n being two-dimensionally arranged. Each aperture 14i (i is any one of 1 through n, this will apply hereinafter) is edged with a pair of electrodes Ei and Gi. Electrodes Gi to Gn are set at 0 V with being connected to a common grounding conductor. Electrodes E1 to En are supplied with driving potentials V1 to Vn from drivers 31 to 3n of BAA driver 30, respectively. The wiring between BAA driver 30 and blanking aperture array mask 14 is preferably as short as possible, for example, 0.5 m in order to reduce the dullness of the pulse shape and the round trip propagation time is approximately 3 nsec. Drivers 31 to 3n receive digital signals S1 to Sn respectively from pattern generator 21. Drivers 31 to 3n have the same construction. An example of the construction of driver 31 is shown in FIG. 2.

In driver 31, signal S1 is delayed by variable delay circuit 311 by a set time and provided to drive circuit 312 to be converted into driving potential V1. Variable delay circuit 311 comprises, for example, one or a plurality of programmable pulse delay circuits such as Motorola-made 100E195 connected in cascade and has register R0 in which the delay time is set. The delay time being set is, for example, 20 psec×128 steps=2.56 nsec at the maximum for one IC. Register R0 receives value D01 from delay time detecting & adjusting unit 40 of FIG. 1. Drive circuit 312 comprises, for example, a complementary bipolar device such as Edge-made EDGE, and outputs 0 V when the input is '0' and outputs, for example, 15 V when the input is '1.' Signal S1 and driving potential V1 are provided to delay time detecting circuits 313 and 314.

In delay time detecting circuit 313, signal S1 is delayed by variable delay circuit 50 and provided to clock input CK of D flip-flop 51. The non-inverting input and the inverting input of comparator 52 receive driving potential V1 and reference potential VA, respectively and the output of comparator 52 is provided to data input D of D flip-flop 51. Reference potential VA is the output of D/A converter 53 having register RA for holding digital input value DA.

Delay time detecting circuit 314 has the same construction as delay time detecting circuit 313 and its components 60 to 63 correspond to components 50 to 53 of delay time detecting circuit 313, respectively.

Register R1 of variable delay circuit 50, register RA of D/A converter 53, register R2 of variable delay circuit 60 and register RB of D/A converter 63 receive values D1, DA, D2 and DB from delay time detecting & adjusting unit 40 of FIG. 1, respectively. From data outputs Q of D flip-flops 51 and 61, determination values C1 and C2 are outputted, respectively, and provided to delay time detecting & adjusting unit 40 of FIG. 1.

Figure 3:
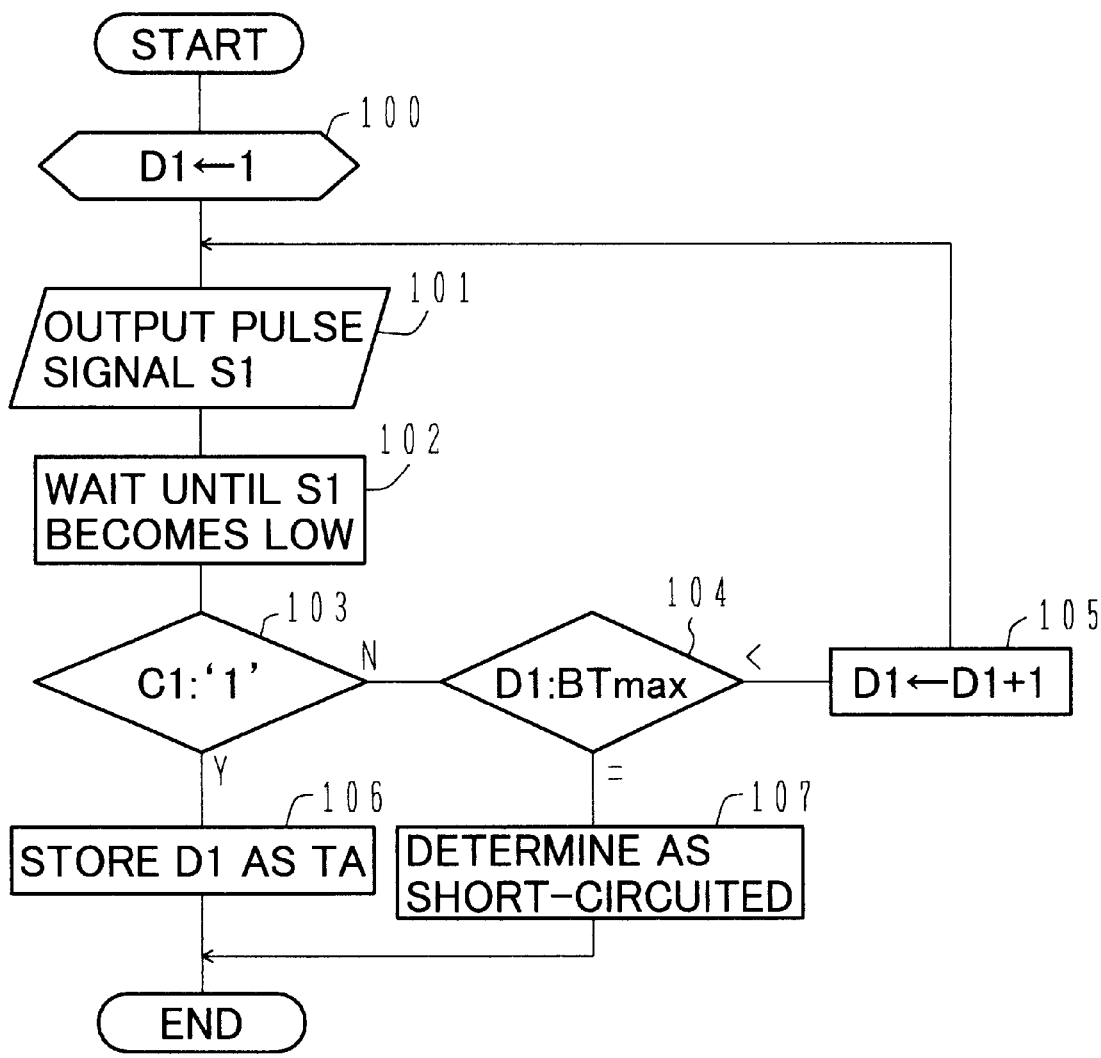
FIG. 3 is a flowchart showing part of a delay time detection processing executed by a delay time detecting & adjusting unit.

Next, a processing by delay time detecting & adjusting unit 40 will be described. FIG. 3 shows part of the delay time detection processing executed by adjuster 40. Hereinafter, the parenthesized numerals will represent step identification numbers in the figure.

In the preprocessing, value D01=0 is held in register R0 of variable delay circuit 311 and value DA=(maximum value Vb of V1)/4 is held in register RA of D/A converter 53.

Figure 4A:
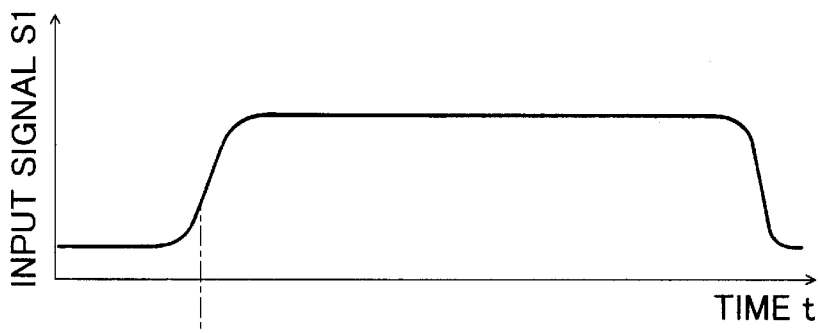
FIGS. 4(A)–4(C) are waveform chart showing an operation of the circuit of FIG. 2.

(100) The initial value 1 of D1 is held in register R1 of variable delay circuit 50. (101) Adjuster 40 causes pattern generator 21 to output pulse signal S1 as shown in FIG. 4(A).

(102) Adjuster 40 waits until signal S1 becomes low.

Figure 4B:
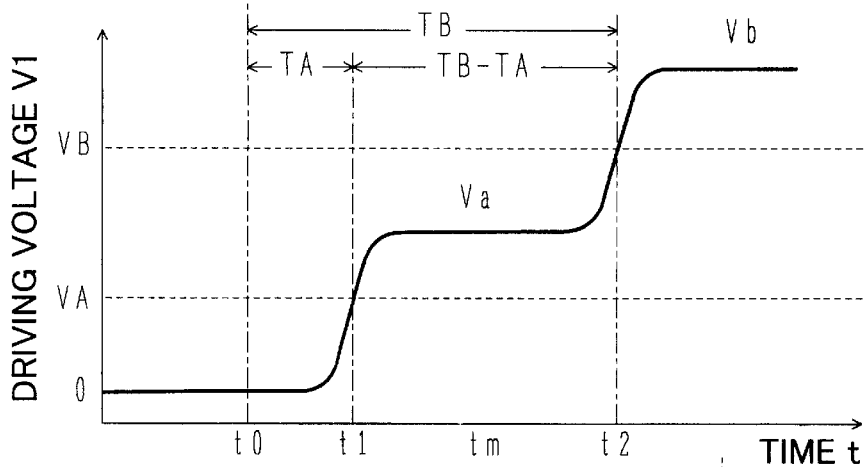

During this time period, output potential V1 of drive circuit 312 rises as shown in FIG. 4(B) and its wave travels to the sides of blanking aperture array mask 14 and comparator 52 as traveling wave V1F. Height Va of traveling wave V1F is approximately half of later-appearing maximum value Vb, for example, approximately half of 15 V. Traveling wave V1F reaches the electrode of blanking aperture array mask 14 to be reflected there and when the reflected wave V1B returns to the output of driver 31, reflected wave V1B are superimposed on traveling wave V1F, so that driving potential V1 becomes Vb which is approximately twice the Va.

In FIG. 4(B), TA represents the signal propagation delay time from rising time point t0 of signal S1 at the input of variable delay circuit 311 to rising time point t1 of traveling wave V1F at the output of drive circuit 312, and TB represents the signal propagation delay time from time point t0 to rising time point t2 of reflected wave V1B at the output of drive circuit 312. Signal propagation delay time T from time point t0 to time point tm of V1F reaching into electrode E1 of blanking aperture array mask 14 is T=TA+(TB-TA)/2.

Figure 4C:
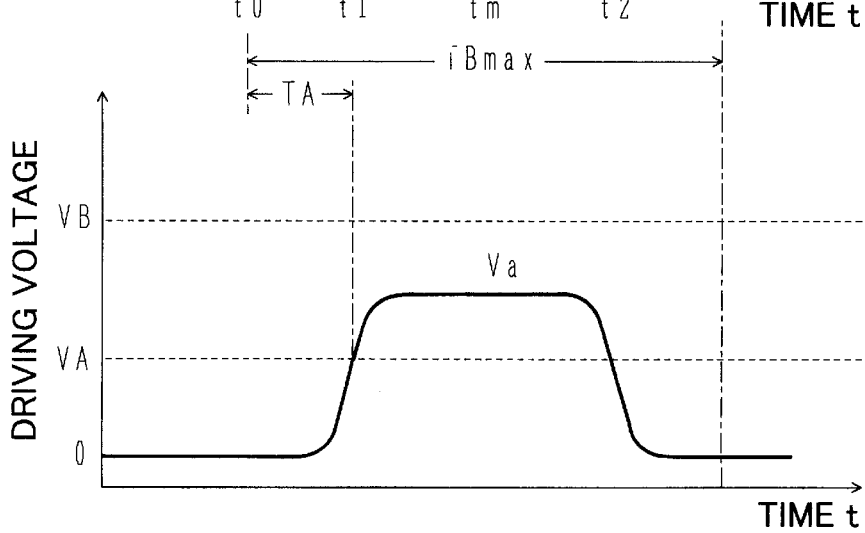

When electrode E1 of blanking aperture array mask 14 or the wiring from driver 31 to electrode E1 is short-circuited with ground, traveling wave V1F is inverted in sign at the point of short circuit and returns to the output of driver 31 as reflected wave V1B, so that the waveform of driving potential V1 becomes as shown in FIG. 4(C).

The output of comparator 52 at the time point of the output rising of variable delay circuit 50 is held in D flip-flop 51 as determination value C1.

(103) If C1='1', the process proceeds to step 106, else the process proceeds to step 104.

(104) If D1=TBmax, the process proceeds to step 107, else the process proceeds to step 105. TBmax is, as shown in FIG. 4(C), a time longer than an estimated maximum value of the time from signal S1 rising to driving potential V1 becoming maximum value Vb.

(105) D1 is incremented by 1 and held in register R1 of variable delay circuit 50. Then, the process returns to step 101.

In repeating steps 101 to 105, when there is no abnormality, C1='1' becomes true at step 103.

(106) D1 is stored in an internal memory as delay time TA and the processing of FIG. 3 is ended.

(107) When C1='0' even at D1=TBmax, it is determined as short-circuited.

After obtaining delay time TA through the processing of FIG. 3, delay time detecting & adjusting unit 40 performs a processing similar to that of FIG. 3 for delay time detecting circuit 314 to obtain delay time TB. In this case, D1 at steps 100, 104, 105 and 106 is replaced by D2, 1 at step 100, by TA+1, C1 at step 103, by C2, and TA at step 106, by TB.

Figure 5:
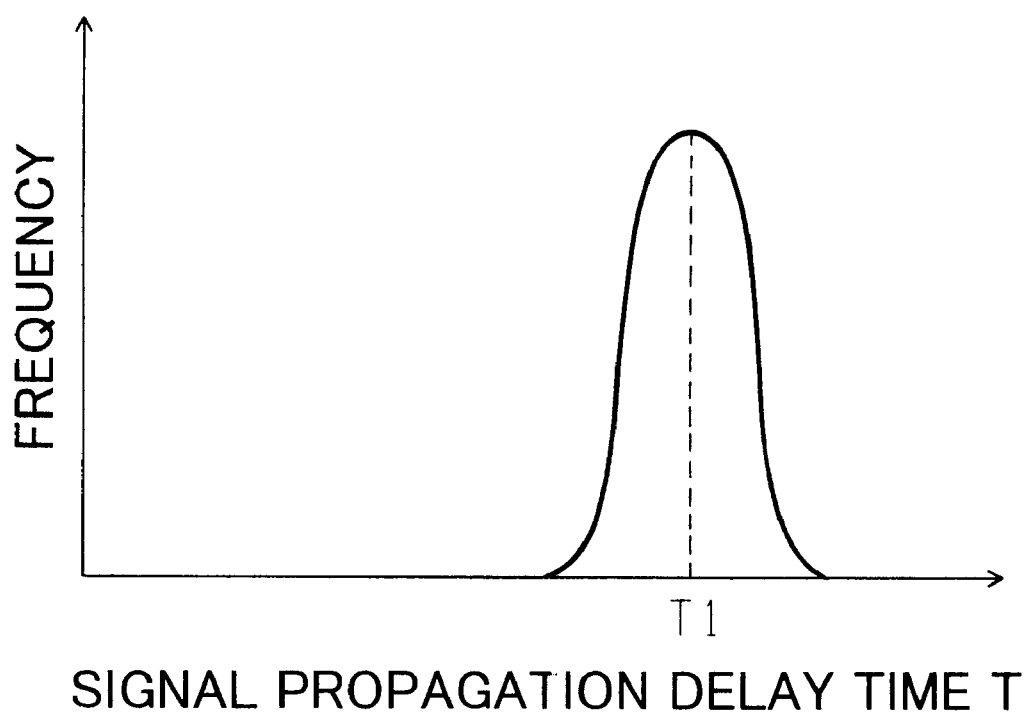
FIG. 5 is a diagram showing a histogram of T=TA+(TB−TA)/2 measured a number of times.

In order to improve the measurement accuracy of delay times TA and TB, the processing is repeated a number of times to obtain a histogram of signal propagation delay time T=TA+(TB−TA)/2 as shown in FIG. 5. Then, a typical value of T, for example, T1 corresponding to the maximum number of occurrences (mode) or being an average value of T is obtained.

The same as processing for driver 31 is successively performed for drivers 32 to 3n. The mode of signal propagation delay time T for signal Si and drive voltage Vi will be denoted as Ti.

Maximum value Tmax of signal propagation delay times T1 to Tn is obtained and Tmax−Ti is set into register R0 of driver 3i.

Consequently, the signal propagation delay times from the input terminals of drivers 31 to 3n to the corresponding electrodes of blanking aperture array mask 14 are all substantially equal to Tmax, resulting in improved accuracy of the exposure pattern projected onto a sample such as a wafer or a mask.

Figure 9:
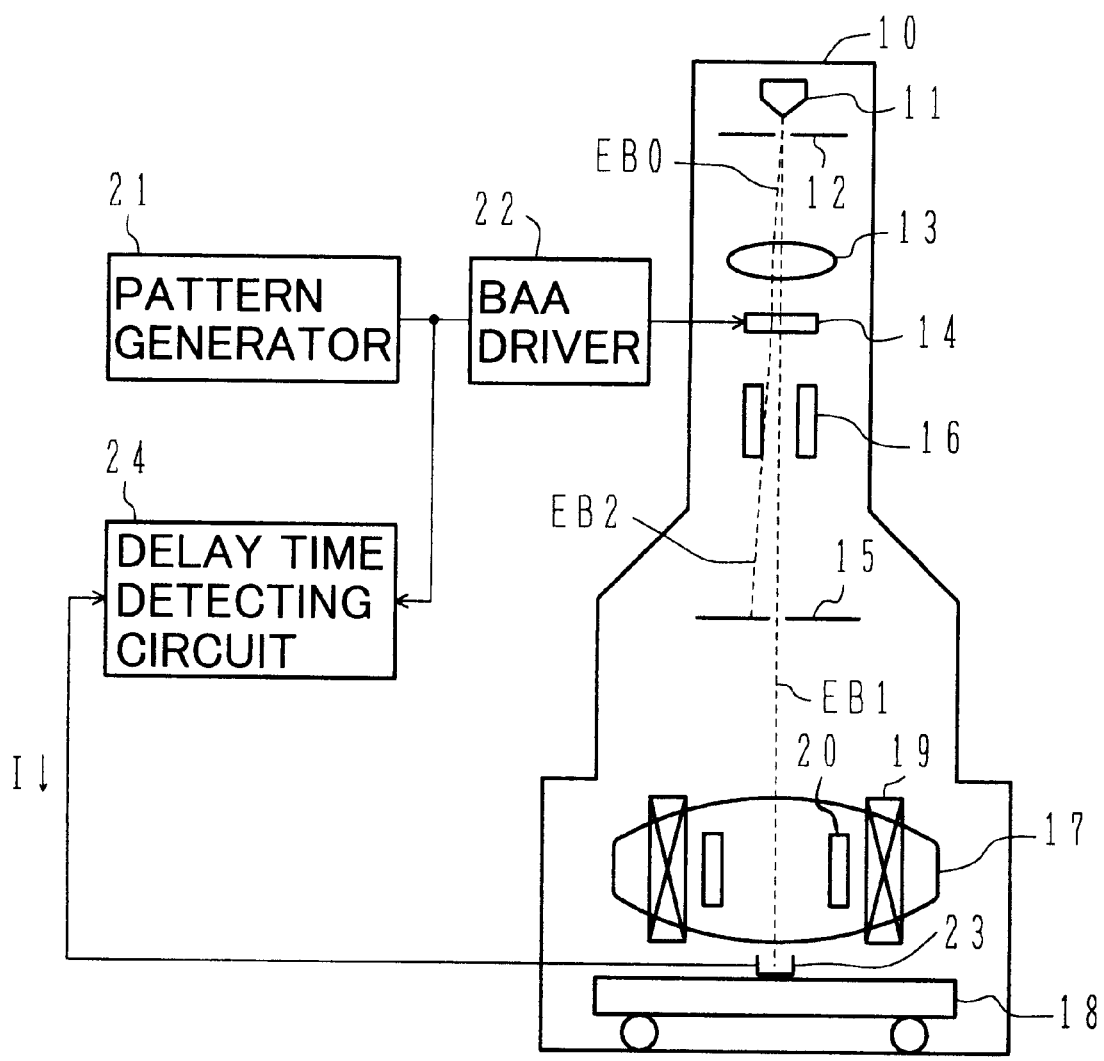
FIG. 9 is a view schematically showing the construction of a conventional electron beam exposure system.
Figure 10:
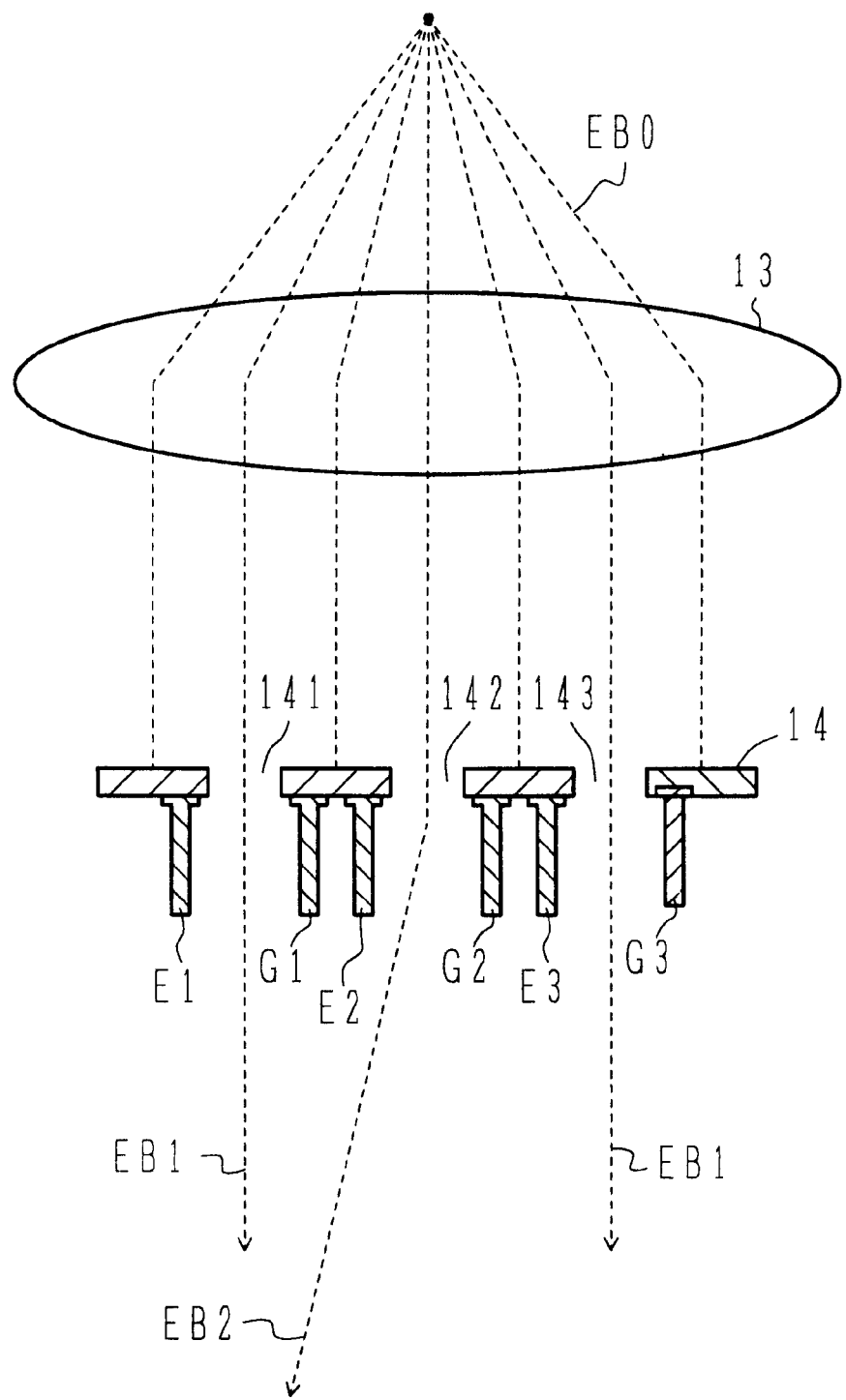
FIG. 10 is a view of assistance in explaining an operation of a blanking aperture array mask of FIG. 9.

Since it is unnecessary to detect the beam current with Faraday cup 23 as shown in FIG. 9, the SN ratio is higher than in the case of FIG. 9. In addition, since the signal transmission line from Faraday cup 23 to delay time detecting circuit 24 as shown in FIG. 9 is unnecessary, the dullness of the signal is smaller than in the case of FIG. 9. Thus, the signal propagation delay time is more accurately measured than was previously possible.

Since the signal propagation delay time is automatically adjusted, the time necessary for the adjustment is reduced, so that the exposure throughput improves.

When signal propagation delay time T greatly differs from those for other drivers, it is considered that disconnection exists on the transmission line from the drive circuit output onward and the disconnection location is estimated with some degree of accuracy based on signal propagation delay time T.

Second Embodiment

Figure 6:
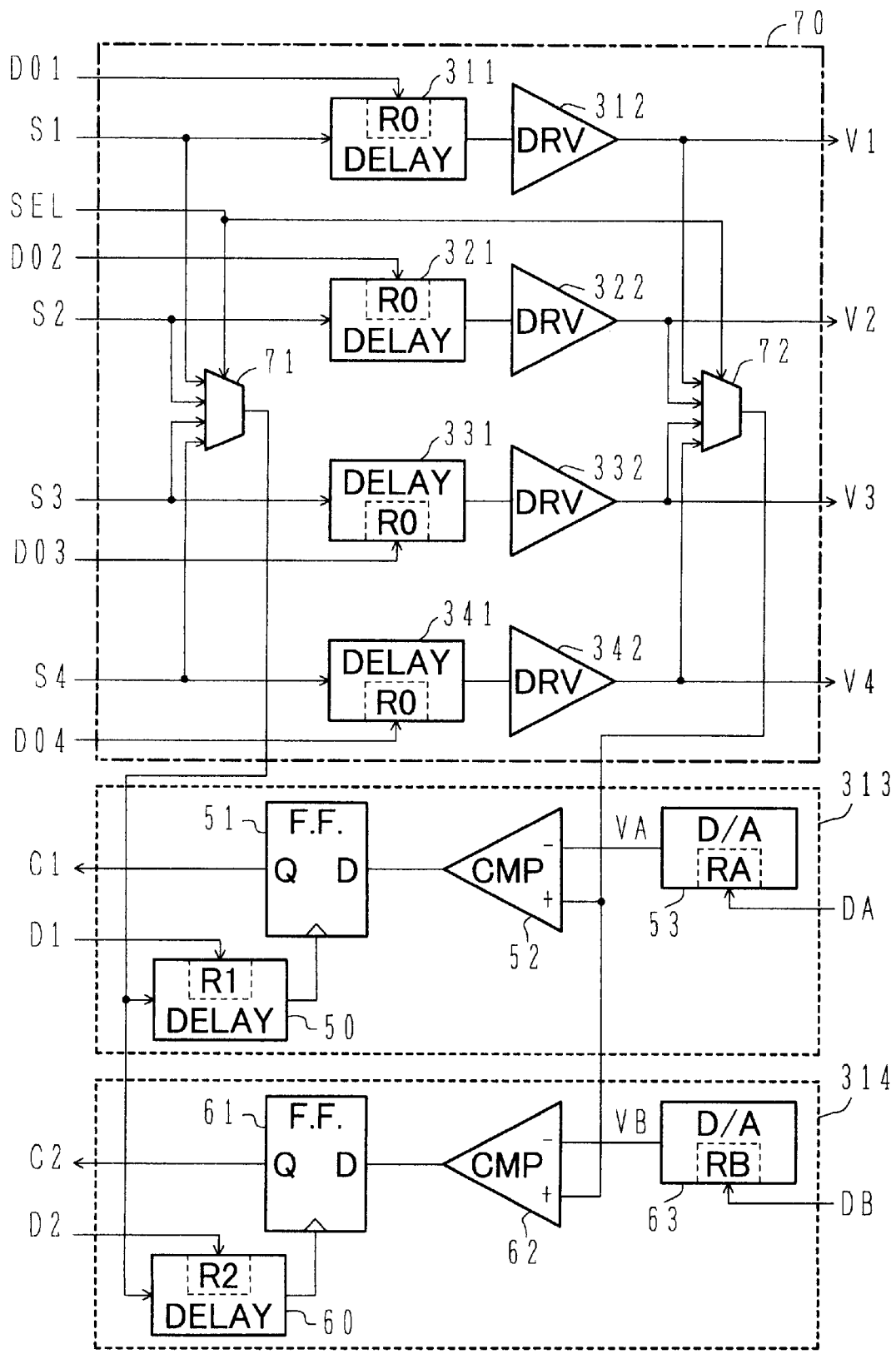
FIG. 6 is a circuit diagram showing a driver in a second embodiment of the present invention.

FIG. 6 shows a driver circuit in the second embodiment of the present invention.

This circuit has one pair of delay time detecting circuits 313 and 314 for circuit 70 having four pairs of variable delay circuits and drive circuits. Delay time detecting circuits 313 and 314 are commonly used by the four pairs. In circuit 70, the output terminals of variable delay circuits 311, 321, 331 and 341 are connected to the input terminals of drive circuits 312, 322, 332 and 342, respectively. Signals S1 to S4 provided to the input terminals of variable delay circuits 311, 321, 331 and 341, respectively, are also provided to the input terminals of selector 71. Selector 71 selects one of signals S1 to S4 in response to selection signal SEL from delay time detecting & adjusting unit 40 of FIG. 1 and provides it to variable delay circuits 50 and 60. Likewise, driving potentials V1 to V4 outputted from drive circuits 312, 322, 332 and 342 are also provided to selector 72, which selects one of driving potentials V1 to V4 in response to selection signal SEL and provides it to the non-inverting input terminals of comparators 52 and 62. Selectors 71 and 72 preferably comprise high-precision relays in order to reduce waveform distortion.

In this configuration, first, signal S1 and driving potential V1 are selected by selectors 71 and 72, respectively, so that the construction is substantially the same as that of driver 31 of FIG. 2 and the same operation as that of driver 31 is performed. Then, signal S2 and driving potential V2 are selected by selectors 71 and 72 and similar processing is repeated thereafter.

According to the second embodiment, the number of delay time detecting circuits 313 and 314 can be reduced to one-fourth that in the first embodiment, so that the mounting area of the circuit board can be smaller than in the first embodiment.

Third Embodiment

Figure 7:
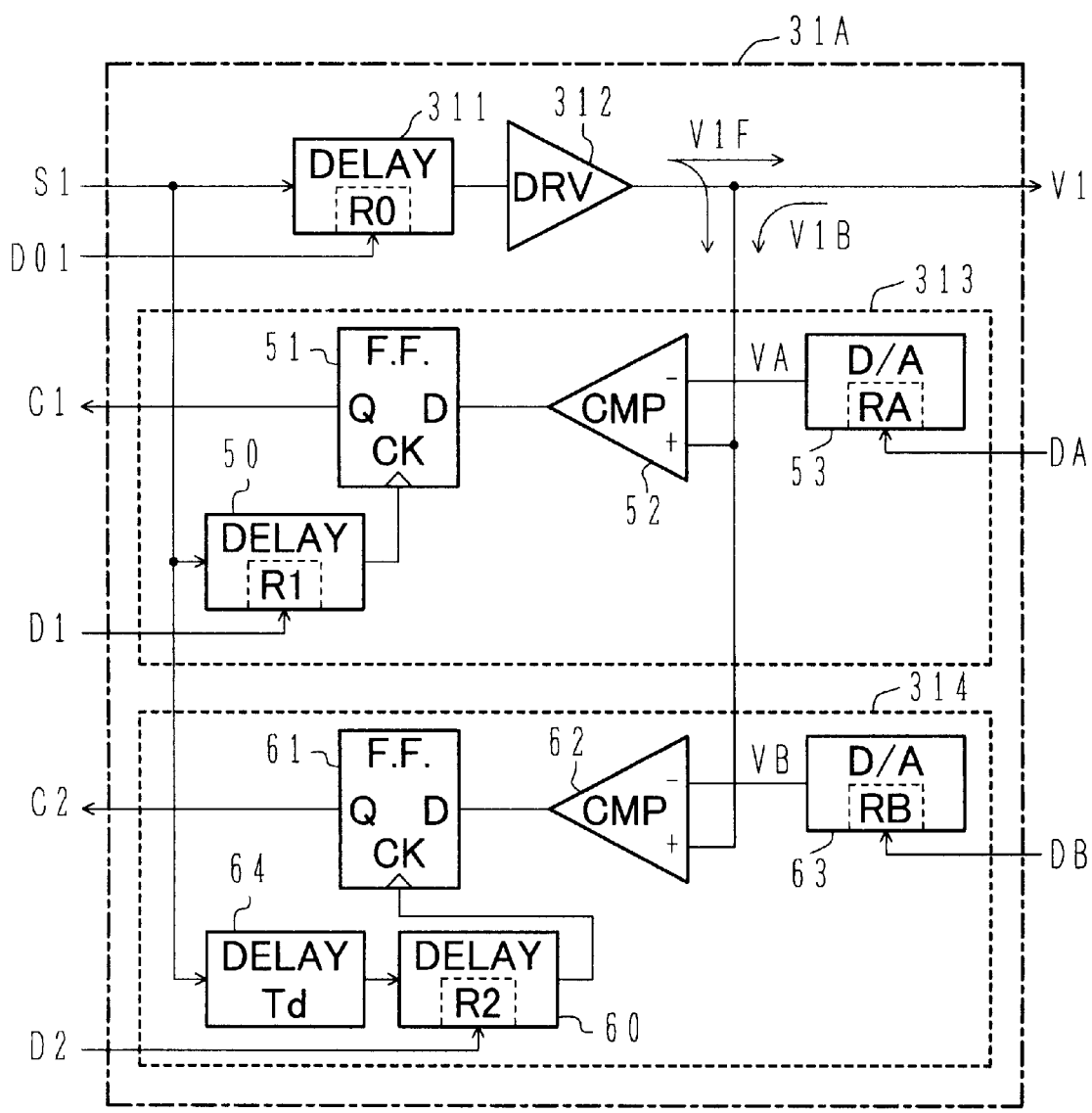
FIG. 7 is a circuit diagram showing a driver in a third embodiment of the present invention.

FIG. 7 shows driver 31A in the third embodiment of the present invention.

In driver 31A, signal S1 is provided to variable delay circuit 60 through delay circuit 64 having fixed delay time Td, for example, three-fifths of upper limit value TBmax shown in FIG. 4. Other portions are the same as those of driver 31 of FIG. 2.

According to the third embodiment, one step of the delay time of variable delay circuit 60 can be shorter than that of the case of FIG. 2, so that the rising time point of the output of comparator 62 can be more accurately detected or variable delay circuit 60 may comprise one IC.

Fourth Embodiment

Figure 8:
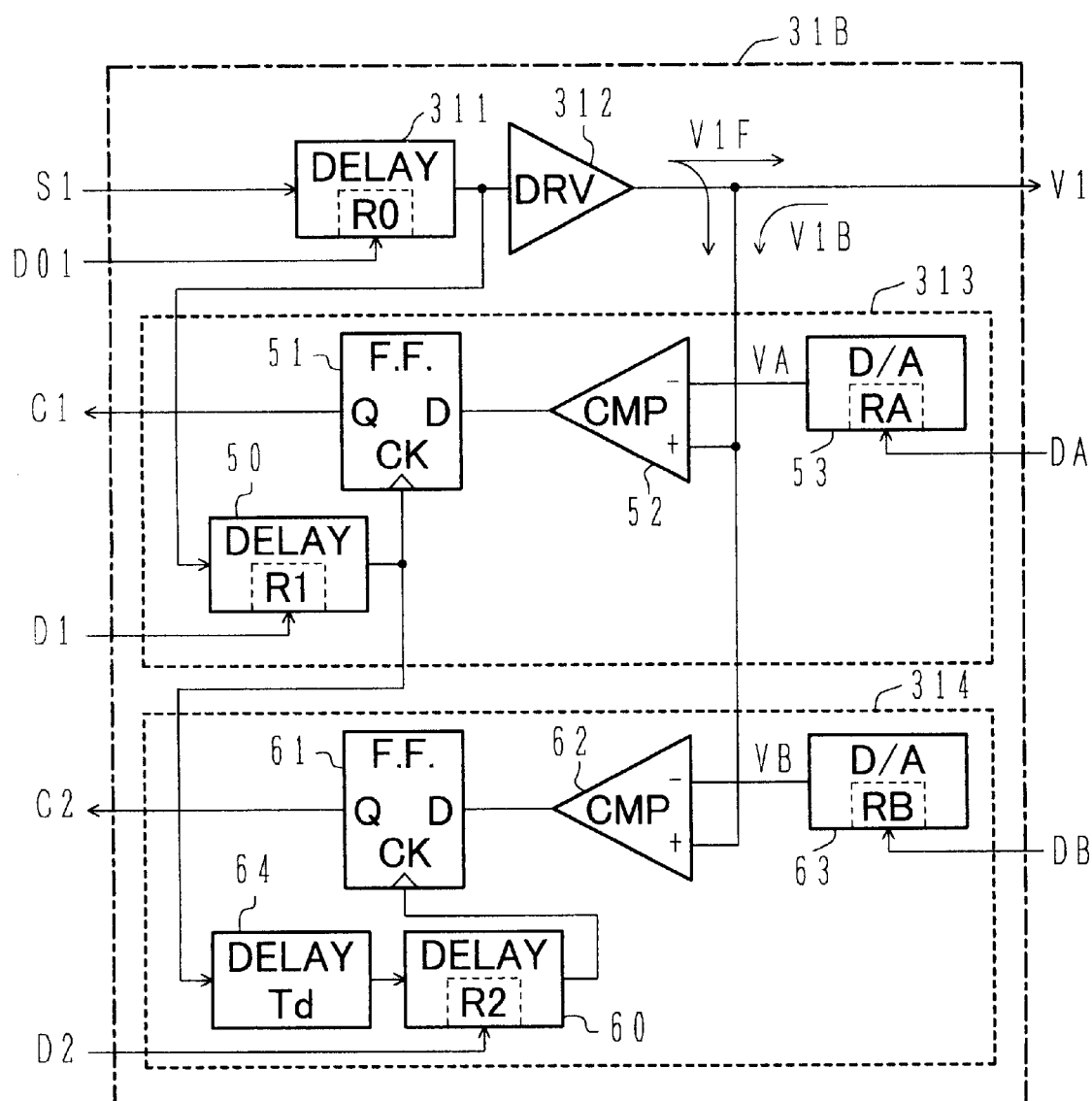
FIG. 8 is a circuit diagram showing a driver in a fourth embodiment of the present invention.

FIG. 8 shows driver 31B in the fourth embodiment of the present invention.

In driver 31B, the input of variable delay circuit 50 is connected to the output of variable delay circuit 311 and the input of delay circuit 64 is connected to the output of variable delay circuit 50. Delay time Td of delay circuit 64 is, for example, two-fifths of upper limit value TBmax. Other portions are the same as those of driver 31A of FIG. 7.

According to the fourth embodiment, by setting appropriate initial value D01 into register R0 of variable delay circuit 311, the same effects as those of the third embodiment may be obtained for variable delay circuit 50.

The present invention includes various other modifications.

For example, in FIG. 2, instead of variable delay circuit 50 and D flip-flop 51 serving as first detecting circuit, the following arrangement may be used: An RS flip-flop is set at the rising edge of signal S1 and reset at the rising edge of the output of comparator 52, high-frequency clock pulses are counted while the RS flip-flop is being set and the count is obtained as delay time TA. This may apply to variable delay circuit 60 and D flip-flop 61 serving as second detecting circuit.

Variable delay circuit 311 may be a preceding stage within driver 31.

In FIG. 2 and FIG. 4(B), reference potential VA may be any value that is between Va and 0. Reference potential VB may be any value that is between Vb and Va.

When variation in signal propagation delay time TA among bits is smaller than variation in signal propagation delay time TB among bits and TA is negligible, in the above-described embodiments, signal propagation delay time T may be T=(TB−TA)/2 instead of T=TA+(TB−TA)/2. In this case, the starting point of TBmax of FIG. 4(C) may be t1.

Furthermore, drive circuit 312 of FIG. 2 may have an arrangement such that inverters are connected in cascade with an odd number of stages so that the binary values of its input and output are opposite to each other.

What is claimed is:

1. A charged particle beam exposure method wherein a charged particle beam passes through apertures of a blanking aperture array mask to be converted into multiple beams, each of output potentials of a drive circuit is respectively provided to each of deflecting electrodes formed at edges of said apertures and a pattern corresponding to a pattern of said output potentials is projected onto an object, said method comprising the steps of:

preparing a variable delay circuit connected to an input side of said drive circuit;

detecting a first time point t1 when a traveling wave of one of said output potentials from said drive circuit traverses a first reference potential;

detecting a second time point t2 when a superimposed wave of said traveling wave and a reflected wave of said one of said output potentials traverses a second reference potential; and adjusting a delay time of said variable delay circuit based on said first time point t1 and said second time point t2.

2. A charged particle beam exposure method according to claim 1, wherein said adjusting is performed in such a way that values {t1+(t2−t1)/2} in regard to all of said output potentials become substantially same to each other.

3. A charged particle beam exposure method according to claim 2, wherein said first time point t1 and said second time point t2 are detected repeatedly, and wherein each of said values {t1+(t2−t1)/2} is calculated by substituting a typical value of said first time point t1 and a typical value of said second time point t2.

4. A charged particle beam exposure method according to claim 1, wherein said adjusting is performed in such a way that values (t2−t1)/2 in regard to all of said output potentials become substantially same to each other.

5. A charged particle beam exposure method according to claim 4, wherein said first time point t1 and said second time point t2 are detected repeatedly, and wherein each of said values (t2−t1)/2 is calculated by substituting a typical value of said first time point t1 and a typical value of said second time point t2.

6. A charged particle beam exposure method according to claim 1, further comprising the step of determining as short-circuited when said second time point t2 cannot be detected even if a set period of time has elapsed.

7. A charged particle beam exposure system provided with a blanking aperture array mask having blanking apertures for a charged particle beam being passed through to be converted into multiple beams, said blanking apertures being edged with deflecting electrodes, and provided with a drive circuit for providing its output potentials to said deflecting electrodes so as to project a pattern onto an object, said pattern corresponding to a pattern of said output potentials, said system comprises:

an adjusting variable delay circuit connected to an input side of said drive circuit to delay propagation of said output potentials;

a first comparator circuit for comparing one of said output potentials from said drive circuit and a first reference potential to detect a front edge of a traveling wave of said one of said output potentials;

a second comparator circuit for comparing said one of said output potentials and a second reference potential to detect a front edge of a reflected wave superimposed on said traveling wave of said one of said output potentials;

a first detecting circuit for detecting a first time point t1 when an output of said first comparator circuit is inverted;

a second detecting circuit for detecting a second time point t2 when an output of said second comparator circuit is inverted; and adjusting equipment for adjusting a delay time of said adjusting variable delay circuit based on said first time point t1 and said second time point t2.

8. A charged particle beam exposure system according to claim 7, wherein said first detecting circuit comprises:
a first detecting variable delay circuit for delaying a signal of an input side of said drive circuit; and
a first determination circuit for determining an output state of said first comparator circuit in response to an output of said first detecting variable delay circuit, and wherein said second detecting circuit comprises:
a second detecting variable delay circuit for delaying a signal of said input side of said drive circuit; and
a second determination circuit for determining an output state of said second comparator circuit in response to an output of said second detecting variable delay circuit.

9. A charged particle beam exposure system according to claim 8, wherein said first determination circuit comprises a first D flip-flop circuit having its data input adapted to receive an output of said first comparator circuit and having its clock input adapted to receive said output of said first detecting variable delay circuit, and wherein said second determination circuit comprises a second D flip-flop circuit having its data input adapted to receive an output of said second comparator circuit and having its clock input adapted to receive said output of said second detecting-variable delay circuit.

10. A charged particle beam exposure system according to claim 9, wherein said adjusting equipment adjusts said delay time in such a way that values {t1+(t2−t1)/2} in regard to all of said output potentials become substantially same to each other.

11. A charged particle beam exposure system according to claim 10, wherein said adjusting equipment causes said first and second detecting circuits to detects said first time point t1 and said second time point t2 repeatedly and calculating each of said values {t1+(t2−t1)/2} by substituting a typical value of said first time point t1 and a typical value of said second time point t2.

12. A charged particle beam exposure system according to claim 8, wherein one set of said first and second comparator circuits and said first and second detecting circuits are provided for a plurality of sets of said adjusting variable delay circuits and said drive circuits, wherein said system further comprising:

a first selector circuit for selecting one of outputs of said plurality of sets of said drive circuits and providing said one of said outputs to said one set of said first and second comparator circuits; and a second selector circuit for selecting one of inputs of said plurality of sets of said adjusting variable delay circuits and providing said one of said inputs to said one set of said first and second detecting circuits, and wherein said adjusting equipment causes said first and second selector circuits to select said one of said plurality of sets.

13. A charged particle beam exposure system according to claim 9, wherein one set of said first and second comparator circuits and said first and second detecting circuits are provided for a plurality of sets of said adjusting variable delay circuits and said drive circuits, wherein said system further comprising:

a first selector circuit for selecting one of outputs of said plurality of sets of said drive circuits and providing said one of said output to said one set of said first and second comparator circuits; and a second selector circuit for selecting one of inputs of said plurality of sets of said adjusting variable delay circuits and providing said one of said inputs to said one set of said first and second detecting circuits, and wherein said adjusting equipment causes said first and second selector circuits to select said one of said plurality of sets.

14. A charged particle beam exposure system according to claim 10, wherein one set of said first and second comparator circuits and said first and second detecting circuits are provided for a plurality of sets of said adjusting variable delay circuits and said drive circuits, wherein said system further comprising:

a first selector circuit for selecting one of outputs of said plurality of sets of said drive circuits and providing said one of said outputs to said one set of said first and second comparator circuits; and a second selector circuit for selecting one of inputs of said plurality of sets of said adjusting variable delay circuits and providing said one of said inputs to said one set of said first and second detecting circuits, and wherein said adjusting equipment causes said first and second selector circuits to select said one of said plurality of sets.

15. A charged particle beam exposure system according to claim 7, wherein one set of said first and second comparator circuits and said first and second detecting circuits are provided for a plurality of sets of said adjusting variable delay circuits and said drive circuits, wherein said system further comprising:

a first selector circuit for selecting one of outputs of said plurality of sets of said drive circuits and providing said one of said outputs to said one set of said first and second comparator circuits; and a second selector circuit for selecting one of inputs of said plurality of sets of said adjusting variable delay circuits and providing said one of said inputs to said one set of said first and second detecting circuits; and wherein said adjusting equipment causes said first and second selector circuits to select said one of said plurality of sets.

\* \* \* \* \*

UNITED STATES PATENT AND TRADEMARK OFFICE
CERTIFICATE OF CORRECTION

PATENT NO.   : 5,910,658
DATED        : June 8, 1999
INVENTOR(S)  : Soichiro ARAI et al.

It is certified that error appears in the above-identified patent and that said Letters Patent is hereby corrected as shown below:

On the title page: ITEM [54] and Column 1, line 3,

Please change "CHANGE" to --CHARGED--.

Col. 11, line 41, change "output" to --outputs--.

Signed and Sealed this

Ninth Day of November, 1999

Attest:

Attesting Officer

Q. TODD DICKINSON

Acting Commissioner of Patents and Trademarks